United States Patent
Agrawal et al.

(10) Patent No.: US 10,256,071 B2
(45) Date of Patent: Apr. 9, 2019

(54) QUANTITATIVE SECONDARY ELECTRON DETECTION

(71) Applicant: ScienceTomorrow, Lexington, KY (US)

(72) Inventors: Jyoti Agrawal, Lexington, KY (US);
David C. Joy, Knoxville, TN (US);
Subuhadarshi Nayak, Lexington, KY (US)

(73) Assignee: Science Tomorrow LLC, Lexington, KY (US)

( * ) Notice: Subject to any disclaimer, the term of this patent is extended or adjusted under 35 U.S.C. 154(b) by 0 days.

(21) Appl. No.: 15/521,278

(22) PCT Filed: Oct. 21, 2015

(86) PCT No.: PCT/US2015/056787
§ 371 (c)(1),
(2) Date: Apr. 21, 2017

(87) PCT Pub. No.: WO2016/077047
PCT Pub. Date: May 19, 2016

(65) Prior Publication Data
US 2017/0309445 A1    Oct. 26, 2017

Related U.S. Application Data

(63) Continuation of application No. 14/918,560, filed on Oct. 20, 2015, now Pat. No. 9,966,224.

(60) Provisional application No. 62/067,163, filed on Oct. 22, 2014.

(51) Int. Cl.
*H01J 37/244*    (2006.01)
*H01J 37/285*    (2006.01)
*H01J 37/28*    (2006.01)

(52) U.S. Cl.
CPC ............ *H01J 37/244* (2013.01); *H01J 37/28* (2013.01); *H01J 37/285* (2013.01); *H01J 2237/2441* (2013.01); *H01J 2237/2446* (2013.01); *H01J 2237/2448* (2013.01); *H01J 2237/24495* (2013.01)

(58) Field of Classification Search
CPC ........ H01J 37/244; H01J 37/28; H01J 37/285; H01J 2237/2441; H01J 2237/244; H01J 2237/2448; H01J 2237/2446; H01J 2237/24495
USPC ... 250/492.1, 492.2, 492.21, 492.22, 492.23, 250/492.3, 396 R, 397, 306, 307, 309, 250/310, 311
See application file for complete search history.

(56) References Cited

U.S. PATENT DOCUMENTS

| | | | |
|---|---|---|---|
| 9,966,224 B2 * | 5/2018 | Agrawal | ................ H01J 37/244 |
| 2016/0148780 A1 * | 5/2016 | Agrawal | ................ H01J 37/244 250/307 |

* cited by examiner

*Primary Examiner* — Nicole M Ippolito
(74) *Attorney, Agent, or Firm* — Peter G. Willis

(57) ABSTRACT

Quantitative Secondary Electron Detection (QSED) using the array of solid state devices (SSD) based electron-counters enable critical dimension metrology measurements in materials such as semiconductors, nanomaterials, and biological samples (FIG. 3). Methods and devices effect a quantitative detection of secondary electrons with the array of solid state detectors comprising a number of solid state detectors. An array senses the number of secondary electrons with a plurality of solid state detectors, counting the number of secondary electrons with a time to digital converter circuit in counter mode.

18 Claims, 8 Drawing Sheets

Direct SE detection can be achieved by an array of SSD that will eliminate noise source.

QUANTITATIVE SECONDARY ELECTRON DETECTION

CROSS-REFERENCE TO RELATED APPLICATIONS

Provisional application No. 62/067,163 filed Oct. 22, 2014 is incorporated by reference. This application claims priority to the provisional application No. 62/067,163 filed Oct. 22, 2014.

STATEMENT REGARDING FEDERALLY SPONSORED RESEARCH OR DEVELOPMENT

This research was not supported by federal research money.

| Inventors: | Dr. Jyoti Agrawal | Lexington, KY |
| --- | --- | --- |
| | Dr. David C Joy | Knoxville, TN |
| | Dr. Subhadarshi Nayak | Lexington, KY |
| Citizenship: | USA | |
| Assignee: | Science Tomorrow, LLC | |

This invention has not been published outside the company.
This invention has not been sold, offered for sale, or used publicly.

BACKGROUND OF THE INVENTION

The field of the disclosure relates to arrays of solid state detectors that work together to determine a quantity of particles or photons emitted by the sample. Other aspects of the disclosure include a detector and methods for counting secondary electrons with an array of solid state devices and a method for reducing the noise from the data derived from the array of solid state devices.

The scanning electron microscope (SEM) is a basic tool in materials science, electronics, energy, medical science and other disciplines, vital to the national and public well-being. Secondary electron (SE) topographic imaging is the most common mode of operation in the SEM. Its current limitations, however, prevent advances that otherwise could be accomplished in SE imaging.

SE imaging is most commonly performed using a scintillator-photomultiplier based Everhart-Thornley (E-T) detector, or some variation thereof. An E-T detector images all sides of features with the contrast originating from SE collection differences due to subtended angle with detector, tilt, edge effect, and shadowing. FIG. 1 depicts the operational features of a traditional Evanhart-Thornley (E-T) scintillator-photomultiplier to form an image from SEs escaped from the sample surface layers. As the electron beam rasters the sample pixel by pixel, the E-T detector collects the low-energy (5-50 eV) SEs. Furthermore, the Faraday Cage is an integral part of an E-T detector. The detector surface maintained at +10 kV further accelerates the SEs. The scintillator layer emits photons upon being impinged upon by the SEs. The photons travel down the light pipe, hit the photocathode, convert into electrical signal, and is amplified. Analog to digital converters (ADC) converts the signal to digital pixels.

The numbers of components in the detector, and the signal processing are subject to sources of noise, distortion, and non-linearity. Hence, measurement using E-T signals has reduced quantitative utility [Reimer, 1985] at high resolution. In FIG. 2 a SEM trace was performed using an electron beam to scan across an array of identical structures [Joy, 2012], recorded from an E-T detector. As the beam reaches the left edge of the first feature, the signal rises sharply. As a result the analog feedback loop starts to reduce the system gain and DC-offset. As the beam keeps scanning on the other side of the feature, the signal level falls but decays even faster because the feedback loop is still driving the signal down. As a result, the signal is highly distorted by the feedback and exhibits increased DC-offset, suppressed dynamic range (see FIG. 2), varying "dark" level from pixel to pixel, poor signal-to-noise ratios (SNR) and non-linear relation between contrast and SE collection [Joy, 2012; Merli, 1995; Kazemian, 2007; Postek, 2012; Bogner, 2007; Oho, 2007; Joy, 1992; Isaacson, 1977; ITRS, 2011: *Metrology Challenges*]. The DoE Electron Scattering Workshop [DOE_BES, 2007] has identified broad research needs in electron microscopy. Similarly, the Semiconductor Industry has identified metrology challenges [ITRS, 2011].

BRIEF SUMMARY OF THE INVENTION

The invention includes devices and methods for a detection of photons or particles with arrays of solid state detectors (e.g., diode, capacitor, CCD). The invention includes arrays of solid state detectors wherein an array is comprised of multiple solid state detectors capable of detecting and counting single photons or particles as a digital counter, as well as methods of use.

The solid state detectors are configured to be reset so they would be again available for counting secondary electrons. The array also includes an electrical connection from one or more solid state detectors to a digital converter in a counter mode to convert the output to digital form, wherein the connection may be multiplexed. A count of the pulses generated from multiple solid state detectors in is associated to a single pixel. Poisson statistics can be used on this data.

In a preferred embodiment, a secondary electron detector may be configured with a Faraday cage to direct a disperse pattern of secondary electrons at an array of solid state detectors, wherein the pattern encompasses most of a solid state detectors of the array. The solid state detectors can be configured to detect, and count single secondary electrons, wherein, the array is a grid consisting of columns, and rows of the solid state detectors. The array of solid state detectors further comprises, a time to digital converter circuits in counter mode, circuits to aggregate, and circuits to store a count of the number of photons or particles.

Another preferred embodiment is a configuration of solid state detectors, wherein multiple solid state detectors are configured to detect one pixel from a sample with Poisson statistical error correction. The configuration of solid state detectors further allows for a stepwise detection of multiple pixels of a sample.

Quantitative Secondary Electron Detection (QSED) using the array of solid state devices (SSD) based electron-counters enable critical dimension metrology measurements in materials such as semiconductors, nanomaterials, and biological samples (FIG. 3).

Other embodiments of the invention use a method of a quantitative detection of secondary electrons with the array of solid state detectors comprising a number of solid state detectors; scanning a beam of charged particles over a target, attracting a number of secondary electrons with a Faraday cage, distributing the number of secondary electrons over the array of solid state detectors and, detecting the number of secondary electrons with the number of solid state detectors, counting the number of secondary electrons with a time to digital converter circuit in counter mode, aggregating the results of a count over the array of solid state detectors, assigning the count to a pixel, and resetting the array of solid state detectors.

A method of reducing the noise involved in a detection of charged particles or ionizing radiation with an array of a solid state detectors; comprising the steps: dispersion of ionized radiation or charged particles over the array; detecting with a plurality of the solid state detectors, wherein a pulse is generated and stored on the solid state detectors; counting the pulses with an integrated circuit digital counter creating a stream of digital data assigned to a pixel; the application of Poisson statistical analysis to the stream of digital data; then the repetition of prior steps with a new pixel.

Accordingly, embodiments of the invention can, in particular, achieve secondary electron imaging with lower noise compared to the conventional technology while benefiting from the aforementioned advantages inherent in solid state detectors.

Applications of Digital Electron Detectors

Quantitative digital electron/photon detectors depending on the substrate/material used could be used in a wide variety of applications ranging from secondary electron detectors in microscopy, position sensitive detectors, infrared detectors in night vision cameras, single photon detectors in Ultra-fast transient spectroscopy, CCD cameras, Energy Dispersive X-ray detectors etc.

In electron microscopy, the standard, bulky and in-efficient Everhart-Thornley detector could be replaced by a much more efficient Si based CMOS technology electron detectors. These Si detectors will be sleek in design with low power consumption, fast, and operating with enhanced quantum efficiency. For example, a Si, Ge or GaAs wafer could be used to make digital secondary electron detectors using a standard CMOS process. As the bandgap of Si, Ge and GaAs falls in the range of 0.66 eV to 1.43 eV, these materials could be used for detection of secondary electrons with or without a small reverse bias voltage depending on the depletion width, diffusion length of carriers and the strength of the electric field.

The same materials could also be used as efficient direct back scattered electron detectors in electron microscopy by augmenting the quantum efficiency with a relatively low signal to noise ratio and increased sensitivity with a slight change in the design of the detector.

Ge and InGaAs could also be used in making near infrared detectors using the standard CMOS fabrication process. For the detection of mid and far infrared radiation a much smaller bandgap material like Hg doped CdTe (bandgap ranging from 0-0.5 eV) could be used.

Also, new generation materials like SiC and diamond with bandgap energies ranging from 3 eV to 4.5 eV can be used in making direct x-ray detectors without any scintillator or fiber optic coupling. These materials could also be used to fabricate detectors that could detect deep UV light with high sensitivity and quantum efficiency.

As far as the implementation of position sensitive detectors go, one could create a double PN junction using the front and back side of the substrate, and use one junction for the detection or X-position and the other for the detection of Y-position. It could also be implemented by creating an array of photodiodes and then by measuring the change in the surface resistance of the diode.

They can also be used in the mass spectrometry as electron multipliers for the detections of ions which could be analyzed by the mass analyzers. Direct digital single electron detectors coupled with phase detection could be as used in TEM for the realization of diffraction patterns.

DETAILED DESCRIPTION OF THE INVENTION

Invention

Figure 1:
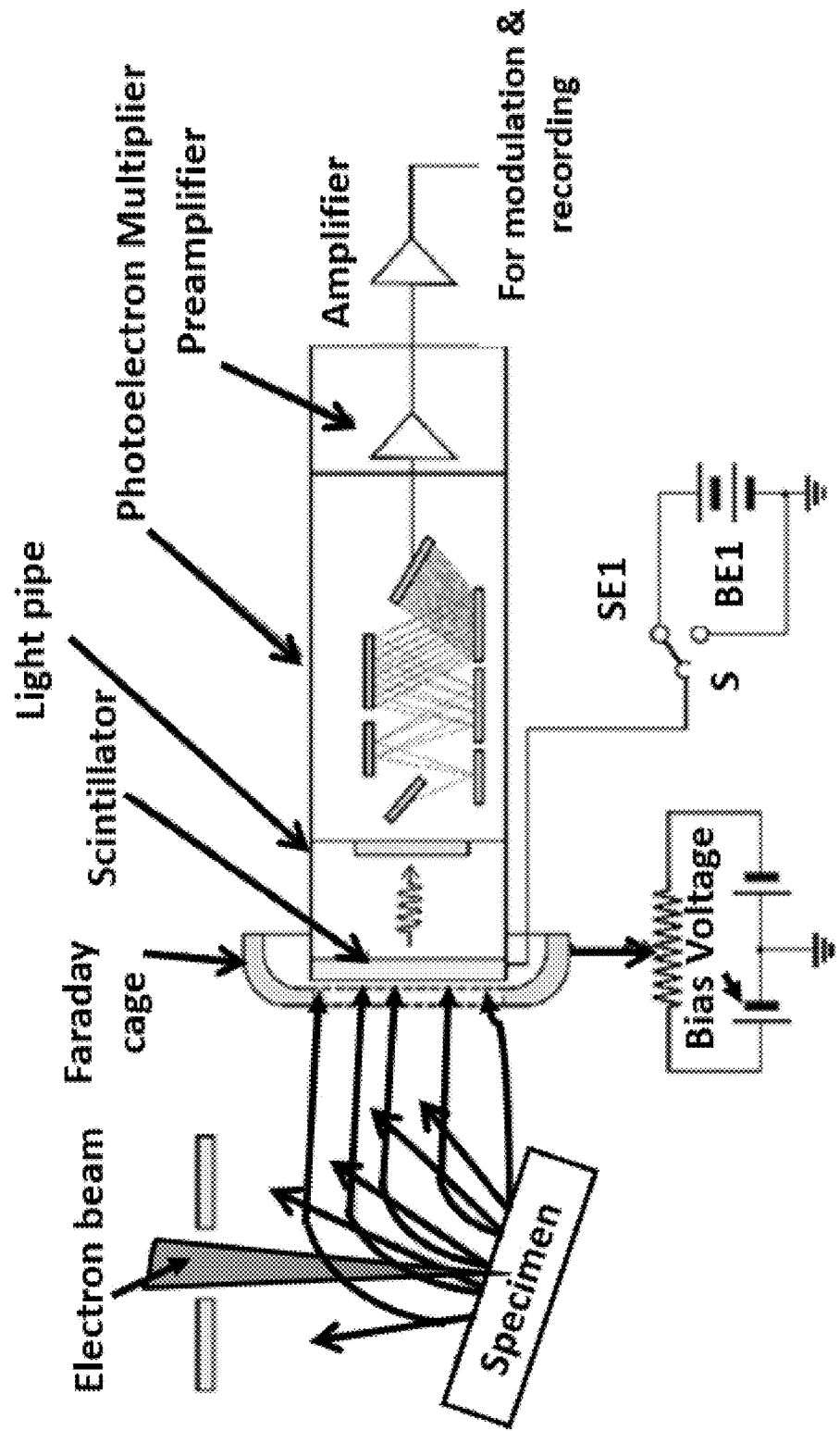
FIG. 1 SE Detection by the ET detector involves several sources of noise and distortion not suitable for metrology FIG. 2 Baseline "black" shifted down no DC restoration on feedback loop.
Figure 2:
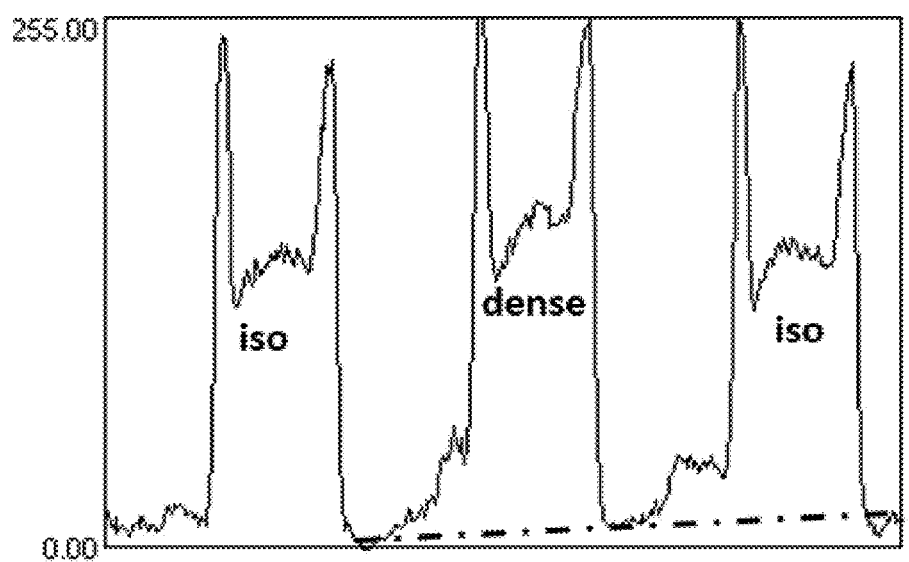
Figure 3:
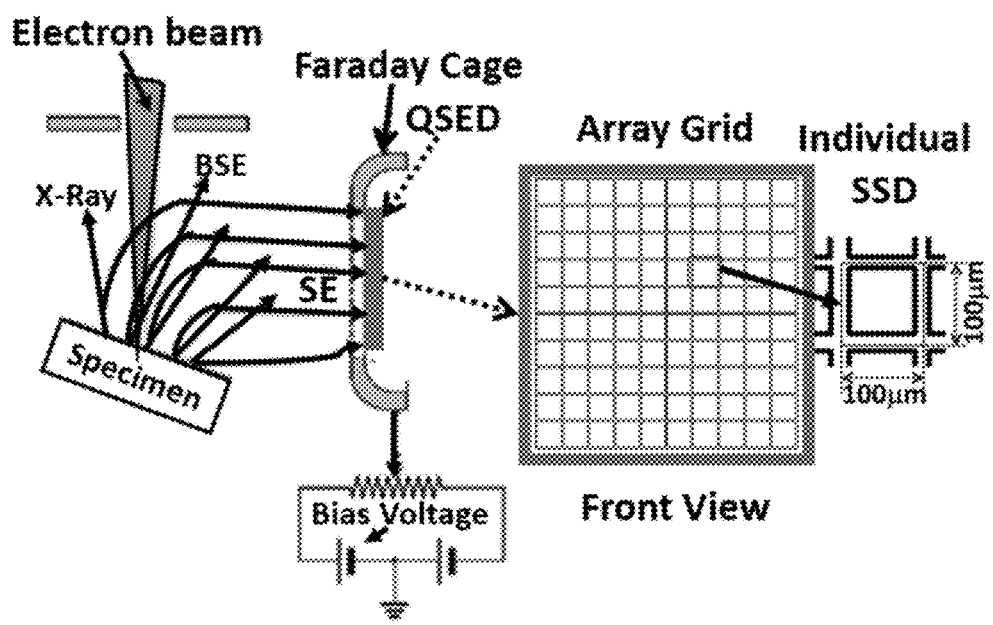
FIG. 3 Direct SE detection can be achieved by an array of SSD that will eliminate noise source.

Direct digital secondary electron imaging is a better method to be able to perform nanoscale quantitative measurement. QSED is based on an array of solid state detectors (e.g., diode, CMOS, CCD), where each device acts as a 'one-shot' electron counter, then resets. The Quantitative Secondary Electron Detection (QSED) using an array of solid state detectors (SSD) based electron-counters enables critical dimension metrology (FIG. 3). The characteristics of a QSED addresses the technical challenges listed above [DOE_BES, 2007; ITRS, 2011; Zajac, 2012; Barbi, 2012].

Technical Approach to Detect Secondary Electrons

The steps of scanning an object with an electron beam, directing output radiation from said object onto an array of solid state detectors, detecting, a counting the number of secondary electrons, and resetting the solid state detectors are followed for acquiring quantitative images. As the electron beam dwells on a pixel of rastering a sample, the secondary electrons are released and diffuse towards one or more of the following; a Faraday cage, lenses, and or guides.

Figure 4:
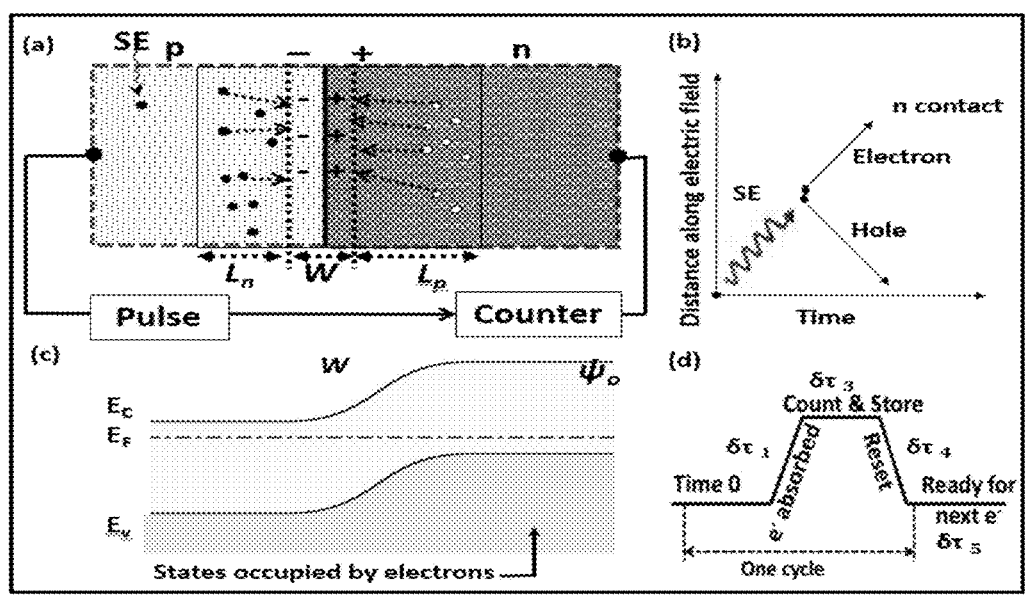
FIG. 4 (a) Impact ionization generates electron-hole pairs; (b) Dynamics of an e-h pair in an electric field; (c) The built in voltage across p-n junctions; (d) Counter IC will count the number of SE's.
Figure 5:
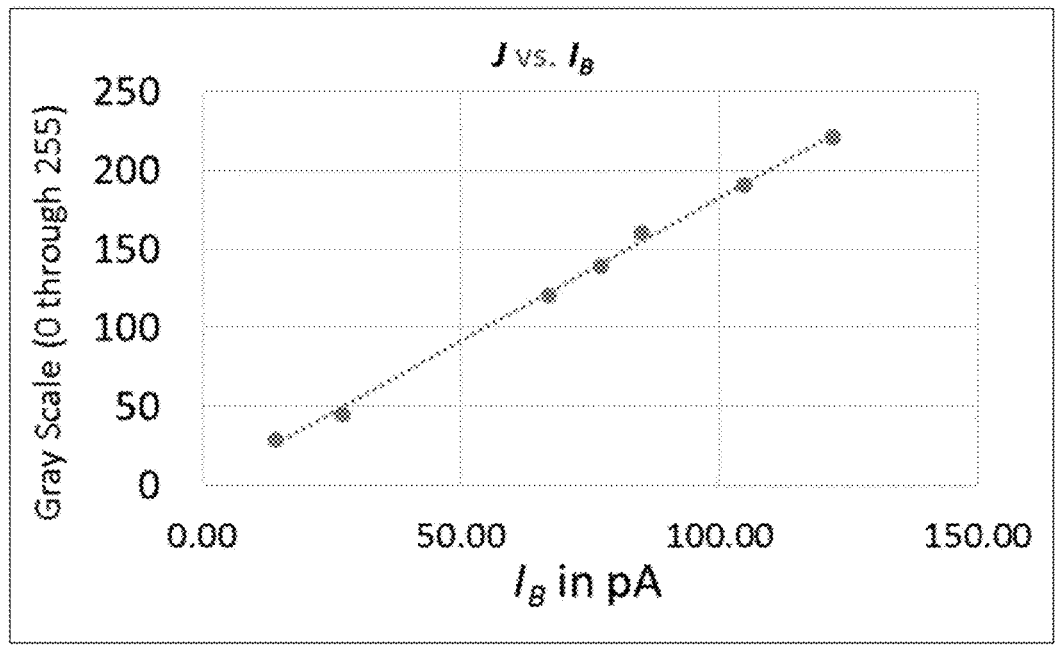
FIG. 5 QSED device current (intensity, J) normalized to 8-bit grayscale as a function of beam current ($I_B$). (SNR=34 dB, DC-offset=−35 dB, Linear (R2=0.992))

The QSED, depicted in FIG. 3, consists of an array of solid state detectors (SSD) to collect SEs. The working of such a SSD—a pn junction diode is depicted in FIG. 4. The excess minority carriers (electron—• and hole—○) generated by incident SE within one diffusion length, $L_p$ on the n side and $L_n$ on the p side, diffuse to the pn junction (width W). They are then swept across the junction by the built-in potential $\psi_o$ and a pulse is created. Then the electron-count of the pixel is increased by one and the PN junction is reset.

The secondary electrons will impinge upon the array of solid state detectors and generate a pulse for counting. At the end of dwell period, the count from all of the solid state detectors is aggregated for each pixel. The beam then moves to the next point corresponding to the next pixel on the image. These steps, continue until all pixels are covered. Finally, the counts are normalized to an X×Y matrix, corresponding to an area on the target, to produce an image calibrated with gray scales.

The pulses generated by a single secondary electron detection event are converted to a digital form by use of a time to digital converter. The time to digital converter works optimally when it processes a one pulse at a time. The time to digital converter can multiplex the solid state devices to the time to digital converters in a ratio of one or more.

In one embodiment (see equation 1) the array comprises a minimum number of solid state devices which for a particular switching frequency used by the detector is greater than or equal to the average number of electrons impinging on the solid state detector times the pixel dwell time wherein said particles or radiation are capable of triggering a measureable detection event on the solid state devices.

Poisson statistics also tell us something about how to determine an optimal number of solid state devices per array of solid state devices. The optimal number of solid state devices in the array is determined by a calculation for a particular switching frequency wherein the probability that one or fewer secondary electrons will impinge on any particular solid state detector in the array per dwell time is greater than 90%.

This calculation involves the uses of equation 2. Statistical processing based on Poisson statistics works best if each measurement or count is an independent event free from the influence of another particle or photon impinging upon the same solid state detector in the same pixel dwell time. Equation 2 can be used to determine the probability that a particle or photon (eg. Electron for an electron detector) will interact with the detector in an independent event. Statistical processing is a useful technique in reducing the noise associated with electron microscope detectors. The array comprising a number of solid state detectors where the probability is greater than 90% are preferred.

A Goal in the design of this quantitative secondary electron device is to have enough SSDs in the array (n) to achieve single electron detection. Further, the optimal operation of the device relies upon each detection being an independent event, enabeling Poisson statistical processing. In equation 1 n is the number of devices in the array, m is the switching frequency, q is the pixel dwell time, and q is the electrons counted per second.

$$n^2 m > q\tau \qquad \text{equation 1}$$

If there is at least a 90 percent probability that each SE detection is an independent event, a digital counter may enable Poisson statistics to be used to estimate an optimal number of Solid State Diodes in the array. This probability is expressed as equation 2. Where k in equation 2 is the number of electrons per diode, and mu is the average # of electrons per diode.

$$\text{probabilitiy} = \sum_{k=0}^{frequency} \frac{\mu^k e^{-\mu}}{k!} \qquad \text{equation 2}$$

Technical Approach to Detect Photons or Charged Particles

The steps of scanning an object with a photon beam, directing output radiation from said object onto an array of solid state detectors, detecting, and counting the number of photons, resetting solid state detectors are followed for acquiring quantitative images. As the photon beam dwells on a pixel of rastering, photons are reflected towards the detector. Another embodiment of the QSED, consists of a lens, lenses, or a light guide and an array of solid state detectors (avalanche photo diode) to collect photons, and an internal circuit to connect the array of solid state detectors to the counter. The SSD a pn junction diode contains excess minority carriers (electron—• and hole—○) generated by incident photons within one diffusion length, $L_p$ on the n side and $L_n$ on the p side, diffuse to the p+n-junction (width W). They are then swept across the junction by the built-in potential $\psi_o$ and a pulse is created. Then the photon-count of the pixel is increased by one and the PN junction is reset.

Technical Approach to the Optimization of the Number of Detectors Per Array

In one embodiment (equation 1) the array comprises a minimum number of solid state devices which for a particular switching frequency used by the detector is greater than or equal to the average number of electrons impinging on the solid state detector times the pixel dwell time wherein said particles or radiation are capable of triggering a measurable detection event on the solid state devices.

An optimal number of solid state diodes can also be determined by use of equation 2. Poisson statistics works best if each measurement or count is an independent event free from the influence of another particle or photon impinging upon the same solid state detector in the same pixel dwell time. Equation 2 can be used to determine the probability that a particle or photon (eg. Electron for an electron detector) will interact with the detector in an independent event.

Figure 8:
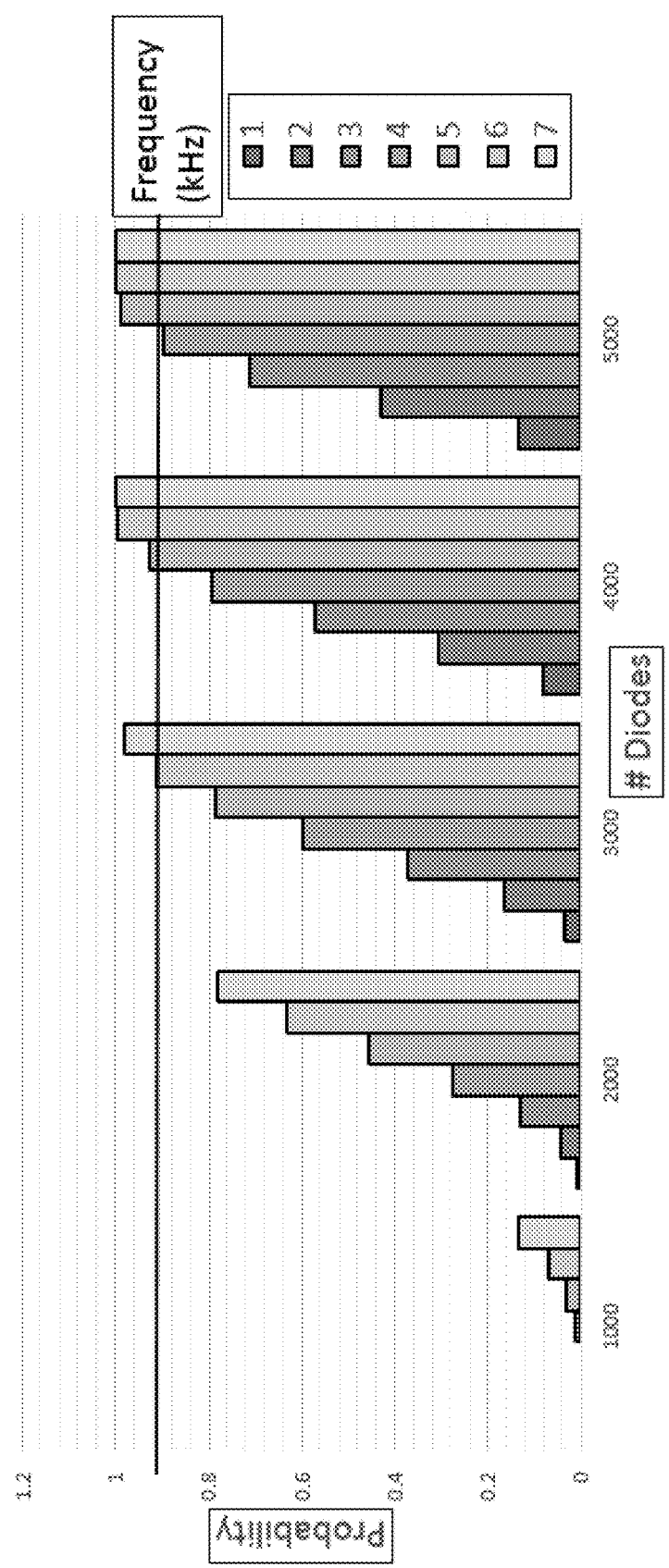
FIG. 8 Calculations for varying # of diodes at various switching frequencies to determine how many SSDs are required for reliable SE detection. Line at 0.9 corresponds to 90% probability that an electron will be detected by a SSD in the array.

The results of this of a modeling experiment are shown in the graph of FIG. 8. The black line on the graph in FIG. 8 is at 90% probability. So, the configurations shown with greater than 90% probability are also preferred. This calculation can also be done at different switching frequencies leading to new configurations.

Applications

The QSED will help overcome the scientific challenges associated with nanoscale dynamical studies among microscope user communities [Barbi, 2012]. For example, measurement of nanoscale properties of back-end-of-line (BEOL) Cu/low-κ and the gaps in the sub-5 nm range—a metrology difficult challenge [ITRS, 2011]—for high-κ gates, thin films dielectric capacitors, interface layers, and interconnect barriers in <16 nm node. Addressing these scientific challenges will directly benefit technological advancement in semiconductors [ITRS, 2011; Abbott, 2012], catalysis [Zajac, 2012], nanotechnologies, medical devices and clean energy [DOE_BES].

Results

The inventors designed and fabricated an array of solid state detectors comprised of p-n junction and following research discovery were made:
1) The QSED produced no more <−30 dB of detector noise its operating range, The improved SNR with QSED as characterized the detective quantum efficiency (DQE) being equal to geometric efficiency [Joy, 1996] as direct digital detection of SE can be threshold to be noiseless [Faruqi, 2005].

2) A near-zero DC-offset was achieved for all operating conditions.

The dynamic range was determined to be 40 dB and no DC-offset was observed in SE detection.

3) The QSED image contrast achieved a near (within ±5%) of measurement value) linear relationship with SE collections.

A near linear (±4% deviation) relationship between pixel signal and beam current was observed. A linear relation with zero-DC offset enabled quantitative, nanoscale, critical dimension measurement from SEM images (CD-SEM).

With modern SEMs (e.g., Agilent 8500 FE-SEM with ADDA3) most of the signals are handled digitally with analog-to-digital (ADC) and digital-to-analog converters (DAC) [Olympus]. The next generation of analog to digital converter improves dynamic range of up to 14 bits, enlarged image sizes up to 12000×12000 increased image acquisition speed up to 25 fps at 600×600 pixels in the active mode.

SSD Array

Figure 6:
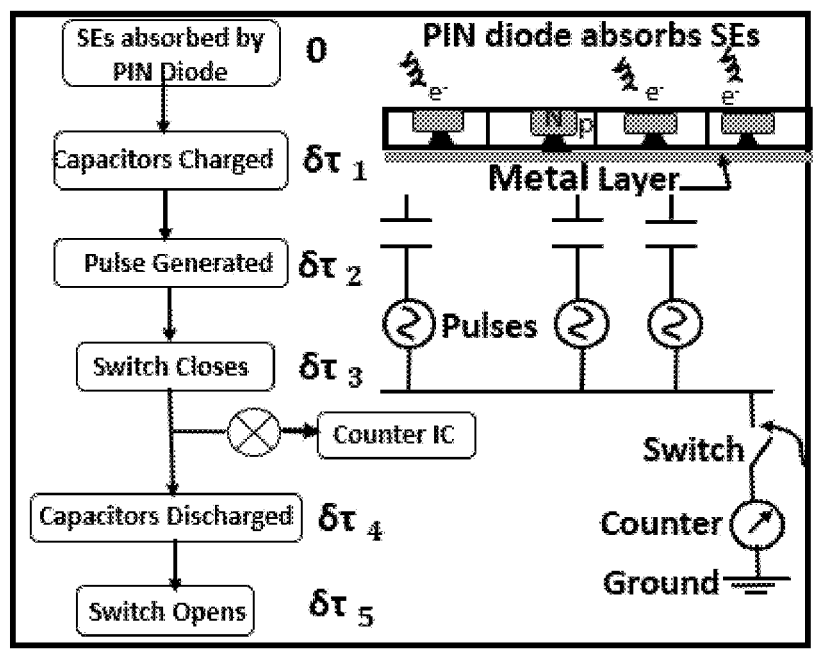
FIG. 6 Counting SEs from the stored capacitor charge.

The QSED device, functionality of which depicted in FIG. 6, was designed and built to achieve SE collection by 10000×10000 (or alternatively 1000 rows and 1000 columns of solid state detectors) pn junction array. Secondary electrons with 3-5 eV of energy were shown to impart enough energy to cause impact ionization which forms the basis of counting SE. Or alternatively it can be shown that devices with 81 rows and 81 columns of solid state detectors may also reliably count SEs when operated at 1 Mhz with an electron beam of typical power.

One embodiment of the QSED device is an array of single electron solid state detectors for use as a secondary electron detector, wherein the detector is being impinged on by a stream of electrons of around 10 million electrons per sec, an array comprises at least 4 rows of single electron solid state detectors, and at least 4 columns of single electron solid state detectors, and wherein the grid comprises at least 6561 cells of single electron solid state detectors will give quantitative data when the solid state detectors cycle at least 1 Mhz or faster wherein the array of single electron solid state detectors is in a square configuration. Other shapes for the array of single electron solid state detectors are within the ability of someone with skill in the art. A preferred configuration for said array of single electron solid state detectors is 81 rows of single electron solid state detectors, and 81 columns of single electron solid state detectors.

A more preferred configuration for this array of single electron solid state detectors is 1000 rows of single electron solid state detectors, and 1000 columns of single electron solid state detectors and cycle at 10 kHz or faster.

Solid State Device

The p-n junction based capacitance in the solid state device (SSD) can be miniaturized to increase density (about 10000×10000 in about 2 cm×2 cm active area). The amount of charge that can be stored in a SSD is limited by built-in voltage and the capacitance. To improve spatial and temporal resolution of imaging, high capacitance and high in-built voltage across the p-n junction are desired.

A solid state device, upon an encounter with an electron, can produce a pulse of photons, voltage, or current. Each PN junction diode unit could act as a detector for SEs. As schematically illustrated in top right corner in FIG. 6, the SE generates electron-hole pairs in the diode [Maes, 1995].

The excess minority carriers (electrons (•) in p and holes (○) in n region) diffuse toward the junction. The minority charge carriers generated one diffusion length ($L_p$ & $L_n$ on the n- and p-side, respectively) can reach the PN junction (width $x_d$) before they recombine [delAlamo, 1987]. Once at the interface, they are swept across the junction by $\psi_0$. The process that determines when a SE is collected thus triggers a pulse (Table 1 & FIG. 4). Electric field ~$10^3$V/cm was observed across depletion region (<1 μm) for built in potential ($\psi_0$) 0.72V. The depletion region occupies most of the space in a SSD.

TABLE 1

The device parameters are designed to maximize detection efficiency.

| Parameter | Symbol | Relation/Value |
|---|---|---|
| Depletion thickness | $x_d$ | $x_d = \sqrt{\dfrac{2\varepsilon_{Si}}{q} \dfrac{N_A + N_D}{N_A N_D}(\phi_0 - V)}$ |
| n-type doping densities | $N_D$ | ≈ 2.2 × $10^{17}$/cm³ |
| p-type doping densities | $N_A$ | ≈ 1.45 × $10^{15}$/cm³ |
| built-in junction potential | $\phi_o$ | $\phi_0 = \dfrac{kT}{q}\ln\left(\dfrac{N_A N_D}{n_j^2}\right)$ (nearly 0.72 V) |
| Negative reverse bias voltage | V | = −5 V |
| Capacitance | C | $C = \dfrac{\epsilon A}{x_d}$ |
| Area of the junction | A | Horse shoe shape increases the area |
| Charge stored in depletion region | $Q_j$ | $Q_j = Aq\left(\dfrac{N_A N_D}{N_A + N_D}\right)x_d = A\sqrt{2\varepsilon_{Si}q\left(\dfrac{N_A N_D}{N_A + N_D}\right)(\phi_0 - V)}$ |

TABLE 1-continued

The device parameters are designed to maximize detection efficiency.

| Parameter | Symbol | Relation/Value |
| --- | --- | --- |
| Junction capacitance | $C_j$ $C_j(V)$ | $C_j = \left\|\dfrac{dQ_j}{dV}\right\|$   $C_j(V) = A\sqrt{\dfrac{\varepsilon_{Si} q}{2}\left(\dfrac{N_A N_D}{N_A + N_D}\right)\left(\dfrac{1}{\sqrt{\phi_0 - V}}\right)}$ |
| Junction capacitance @ zero bias | $C_{j0}$ | $C_{j0} = \sqrt{\dfrac{\varepsilon_{Si} q}{2}\left(\dfrac{N_A N_D}{N_A + N_D}\right)\left(\dfrac{1}{\phi_0}\right)}$   $C_j(V) = \dfrac{A C_{j0}}{\left(1 - \dfrac{V}{\phi_0}\right)^m}$ |
| Gradient coefficient | m | = 0.5 for abrupt junctions & 1/3 for linearly graded junction. |

Capacitance

Once created an electron-hole pair (ehp) is separated in the depletion region in the opposite direction leading to a pn junction capacitor. To increase efficiency of the detector, the capacitance ($C_j$) must be maximized. However, the response time ($\tau$) of the device decreases as $\tau=RC_j$, a time constant. $RC_j$ is determined from the n+ regions forming pn junctions with the surrounding p-type substrate. Dopant concentration profile affects the switch time and parasitic delay. The average $C_j$ in Phase I device was 0.13 pF and R 12 k$\Omega$, giving time constant ~2 $\mu$s. The time constant, RC can be further reduced to <2 ns for faster response. The sources of variation in R and $C_j$ must be controlled to minimize variation in switching.

SSD Array

Ideally, entire solid state detectors should consists of the p-n junction depletion regions ready to collect the SEs. The insulators, metal pads, and other circuitry reduces the real estate available for SE collections. An optimum area of the detector was computed. For example, ion implantation or via through-hole enables contact routing and pad on the back side freeing up area in the front face for SE collection. Further, the signal can be enhanced by connecting multiple capacitors in daisy chains. By staggering operation of groups of capacitor (in daisy chains), the off-time of SEs collection can be minimized. A bias voltage (+150V to +300V) was applied to the Faraday cage to attract the SEs towards the detectors. An appropriate bias voltage can ensure that enough SEs arrive at the detector.

QSED Device by IC Fabrication Processes

The SE signal was collected over 100 $\mu$m×100 $\mu$m p-n junction area in an array of 1000 rows and 1000 columns of solid state detectors, which can be miniaturized into 10000× 10000 array of 1 $\mu$m×1 $\mu$m devices.

Figure 7:
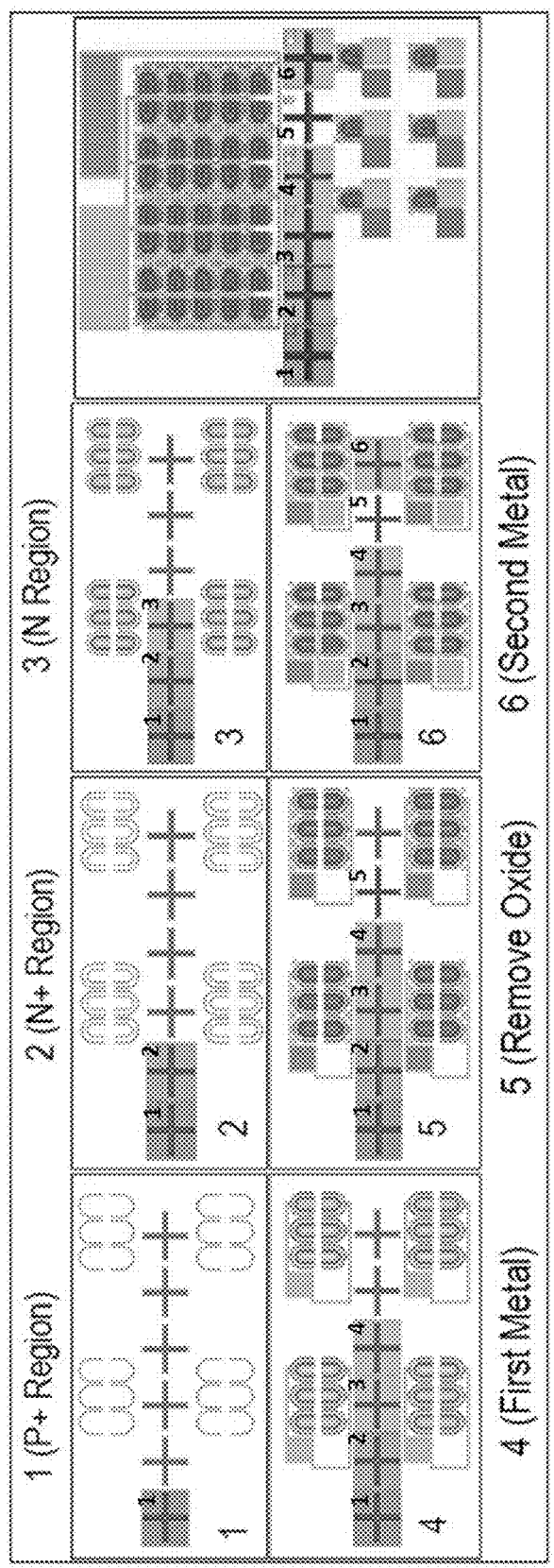
FIG. 7 Masks for processing steps of SSD. Mask #0 (not shown) was used for alignment marks.

The QSED utilized six masks for making horseshoe shape capacitors (FIG. 7). A single-crystal p-Si wafer 150 mm in diameter and about 0.75 mm thick and polished to obtain a very regular and flat surface was used. The process steps to produce the desired circuit grouped into two major parts: Front-end-of-line (FEOL) processing for the p-n junction based capacitance device and the back-end-of-line (BEOL) processing or metal contacts. The doping chemistry and dimensional tolerance were closely controlled to enhance signal to noise ratio. One example of the doping density and dimensions is shown in table 1. Further embodiments are within the capabilities of one skilled in the art. The solid state detector array can be fabricated via standard planar photolithographic and chemical processing process step sequence during which SSDs and ICs are gradually created on a wafer.

SE Counter Integrated Circuit

In QSED the solid state detectors are devices (e.g., diode, capacitor, CCD), where each device acts as a 'one-shot' electron counter, then resets. The IC provides counter functionality to QSED. At time 0, a SE impacts and ionizes to create multiple hole-electron pairs. The read-out electronics then add "1"—for pulse current. If allowed, charge carriers quickly re-combine and the device resets. The pn potential returns to equilibrium (current=0; potential=$\psi_0$) and is ready to detect the next SE. Since SEs as well as SSDs are independent and uncorrelated, Poisson statistics apply to this situation: a mean number N electrons produced per rastering pixel for an incident beam current $I_B$ (pA), and the charge was measured for dwell time $\tau(\mu s)$, then N=6 $I_B$ $\delta\tau$.

The enabling technology is the electron counter based on fast complementary metal-oxide semiconductor (CMOS) time-to-digital converter circuits. SE detection produces a fast electrical pulse in response to the detection of even a single SE (see FIG. 7). With simple level shifting, this pulse can trigger a digital CMOS circuit incorporated into the pixel. Single-SE sensitivity was achieved along with sub-nanosecond timing precision. Because the timing information is digitized in the pixel circuit, it is read out noiselessly.

A multiplexed transistor arrays of time to digital converter circuits was used to provide high-density access to multiples of the solid state detectors for characterization [Realov, 2009]. The multiplexed transistor arrays of time to digital converter circuits was designed and fabricated to provide high-density access to multiple devices for characterization. An on-chip current voltage characterization system allows for rapid characterization of a large, dense SSD array of multiplexed devices, eliminating the effects of switch resistances [Faruqi, 2005].

8. BIBLIOGRAPHY & REFERENCES CITED

[Barbi, 2011]: N Barbi et al (2011). A photomultiplier SSD for imaging, Microscopy & Microanalysis, 17 (2).
[Barbi, 2012]: Barbi et al; PulseTor, LLC; Scintillator-Photomultiplier Combination & Electron Microscope . . . ,
[Bogner, 2007]: Bogner A et al., A history of SEM developments: "wet-STEM" imaging, Micron, 38 (4), 2007.

[delAlamo, 1987]: del Alamo J A and R. M. Swanson, Solid State Electron. 30, 11 (1987) 1127-1136. [DOE_BES, 2007]: Future science needs and opportunities for electron scattering: BES workshop, March 2007.

[Faruqi, 2005]: A R Faruqi et al; Direct single electron detection with a CMOS detector for electron microscopy; Nuclear Instruments & Methods; A546; 2005.

[Faruqi, 2005b]: A R Faruqi et al, Noiseless direct detection of electrons for EM, Nuclr Instr; A546(1-2), 2005.

[ITRS, 2011]: Intern Tech Roadmap for Semiconductors (ITRS); Semiconductor Industry Assoc (SIA), 2011. [FEI, 2010] http://www.fei.com/uploadedfiles/documents/content/introduction_to_em_booklet_july_10.pdf.

[Goldstein, 1990]: Principles of Analytical Electron Microscopy; Goldstein J, Joy D C, Romig A D; 1990.

[Hitachi] SU8040; www.hitachi-hta.com/sites/default/files/literature/HTD-E187-HitachiSU8040datasheet.pdf

[Isaacson, 1977]: M Isaacson et al; Observation of atomic diffus" by STEM; 74(5), Proc. Natl. Acad. Sci. 1977.

[Joy, 2009]: Joy D C, "SEM: Second best no more", Nature Materials 8, (2009)

[Joy, 1996]: D C Joy, C S Joy, R. D. Bunn: "Measuring the Performance of SEM Detectors"; Scanning 18, 1996.

[Joy, 1992]: Joy D C; Pawley J B; High-resolution SEM; Ultramicroscopy 47 (I 992) 80-100.

[Joy, 1991a]: Joy, D. C. (1991 a). Contrast in high resolution SEM images. J. Microsc. 161(11), 343-355.

[Joy, 1991b]: Joy D C. LVSEM. In Electron Microscopy and Microanalysis 1987, Inst Phys Conf Series, I.O.P.

[Joy, 1987]: Joy, D. C. (1987). A note on charging in LVSEM. Microbeam Anal. 22, 83-86.

[Joy, 1985]: Joy, D. C. (1985). Resolution in LVSEM. J. Microsc. 140(111), 283-292.

[Joy, 1982]: Joy D C et al 'fast SE in degrading spatial resolution in analytical EM. J. Microsc. 128(11), RPI. 1982

[Kazemian, 2007]: P. Kazemian et al; Quantitative SE energy filtering in a SEM; Ultramicroscopy 107 (2007).

[Maes, 1990]: W. Maes, K. De Meyer; R. Van Overstraeten; "Impact Ionization in Silicon: A Review and Update"; Solid-State Electronics Vol. 33, No. 6, pp. 705-718, 1990.

[Merli, 1995]: PG Merli et al ' . . . resolution of semiconductor multilayers with a SEM'; Ultramicroscopy 60, 1995.

[Oho, 2007]: Oho E, Suzuki K, Yamazaki S; Quality Improvement of Environmental Secondary Electron Detector Signal Using Helium Gas in Variable Pressure SEM; Scanning; Vol. 29, 225-229 (2007).

[Postek, 2012]: Postek M, 'Does SEM really tell the truth?' SPIE Defense Sensing: Scanning Microscopy; 8378.

[Realov, 2009]: S. Realov, W. McLaughlin, K. L. Shepard, "On-chip transistor characterization arrays with digital interfaces for variability characterization" International Symposium on Quality Electronic Design, 2009.

[Reimer, 1985]: Reimer L; SEM physics of image formation and microanalysis, Springer-Verlag (1985).

Glossary

A count is a discrete measure of the number of an item or event wherein the increment is either 1 or 0.

A time to digital converter is a circuit or array of circuits that acts as a counter taking disperse packets of analogue data and converting them one at a time into a digital number.

SE is an abbreviation for Secondary Electron

SEM is an abbreviation for scanning electron microscope.

SSD is an abbreviation for solid state detector.

A QSED device is a quantitative secondary electron device.

E-T detector is a scintillator-photomultiplier based on an Everhart-Thornley (E-T) detector.

CMOS Complementary metaloxide semiconductor is a technology for constructing integrated circuits. "CMOS" refers to both a particular style of digital circuitry design and the family of processes used to implement that circuitry on integrated circuits (chips).

An array is a set of multiple units arranged together. The units are arranged in a logical repeating pattern. Arrays are described as being arranged in a linear, rectangular, diamond shapes or a different 2 dimensional shape, however, the individual units have a 3-dimensional shape.

A count is a discrete measure of the number of an item or event.

A time to digital converter is a circuit or array of circuits that acts as a counter taking disperse packets of analogue data and converting them one at a time into a digital number.

The invention claimed is:

1. A quantitative secondary electron detection device comprising:
    a circuit to aggregate a count of a number of secondary electrons;
    a circuit to store a count of a number of secondary electrons;
    a circuit comprising a time to digital converter;
    an electrical device or a magnetic device, configured to attract secondary electrons in a disperse pattern over an array of PIN diodes;
        wherein the PIN diodes are configured to detect and count a number of secondary electrons over a dwell time.

2. The quantitative secondary electron detection device of claim 1,
    further wherein, the array of PIN diodes are configured to detect and count a number of secondary electrons wherein an electron beam comprises: a normal emitter, a low power emitter, suitable for volatile samples, and a high power emitter.

3. The quantitative secondary electron detection device of claim 1,
    also comprising;
        a connection to a counter internal circuit.

4. The quantitative secondary electron detection of claim 3,
    wherein the PIN diode has a response time of 2 microseconds or less;
    and wherein the array is comprised of at least 81 rows, and at least 81 columns.

5. The quantitative secondary electron detection device of claim 1,
    wherein the array of PIN diodes is a grid consisting of at least 1000 columns, and at least 1000 rows.

6. The quantitative secondary electron detection device of claim 1,
    wherein the PIN diode operate with a positive potential in a reverse bias mode.

7. The quantitative secondary electron detection device of claim 1,
    wherein the grid is a shape selected from the group comprising a square, a rectangle, a diamond, a circle, and an oval.

8. The quantitative secondary electron detection device of claim 1, further comprising a kit for replacement of an existing secondary electron detector, wherein the kit comprises software configured for treatment of a data output from the array of solid state detectors.

9. A method for a quantitative detection of secondary electrons with an array of PIN diodes comprising the steps:
scanning a beam of charged particles over a target;
attracting a number of secondary electrons with a faraday cage;
distributing a number of secondary electrons over the array;
detecting the number of secondary electrons with the array, creating a current change and a voltage change;
aggregating data consisting of either the current change, the voltage change, or both the current change and the voltage change over the array of solid state detectors;
counting the number of secondary electrons with a time to digital converter circuit in counter mode;
assigning the count to a pixel; and
resetting the array.

10. The method of claim 9, wherein;
the step of detecting the number of secondary electrons with the array is done before
the step of counting the number of secondary electrons with the time to digital converter circuit.

11. The method of claim 10, further comprising:
operating the PIN diode with a positive potential in a reverse bias mode.

12. The method of claim 10, wherein the detector is integrated with a lens, set of lenses or a faraday cage.

13. The method of claim 9, further comprising later steps wherein, the array is reset and wherein the method is repeated, and Poisson statistics are applied to the data.

14. The method of claim 9, wherein the PIN diode is a single electron detector.

15. The method of claim 14, further comprising:
setting a dwell time of the solid state detector and adjusting a number of solid state detectors sets to a probability of less than 10 percent a chance of more than one of the number of secondary electrons arriving at one of the solid state detectors over the dwell time.

16. A quantitative detection device for the detection of photons and/or particles comprising:
a circuit to aggregate a count of photons and/or particles;
a circuit to store the count of photons and/or particles;
a circuit comprising a time to digital converter;
a device configured to disperse photons and/or particles from a single spot on an object over an array of PIN diodes;
wherein the array comprises:
at least a number of PIN diodes and further wherein the number of detectors is greater than a rate of photons or particles impinging upon the array divided by a switching frequency of the solid state detectors.

17. The quantitative detection device of claim 16 wherein the array comprises an optimal number of PIN diodes wherein, at a particular switching frequency used, there is at least a 90% chance that a single photon or particle will impinge upon the detector in an independent event.

18. The quantitative detection device of claim 16 further comprising: an emitter of photons or particles configured to iteratively illuminate a sample in a grid like pattern, wherein the array is used to detect particles and/or photons emitted and/or reflected by the sample.

* * * * *